(12) United States Patent
Shimizu et al.

(10) Patent No.: US 8,112,881 B2
(45) Date of Patent: Feb. 14, 2012

(54) METHOD FOR MANUFACTURING MULTILAYER WIRING BOARD

(75) Inventors: Kazuhiro Shimizu, Ishikawa (JP);
Masanobu Yagi, Ishikawa (JP);
Kenichiro Hanamura, Ishikawa (JP);
Mitsuyuki Takayasu, Ishikawa (JP);
Kiyoe Nagai, Ishikawa (JP); Tomoo Iijima, Tokyo (JP)

(73) Assignees: Tessera Interconnect Materials, Inc., San Jose, CA (US); Sony Chemical & Information Device Corporation (JP)

( * ) Notice: Subject to any disclaimer, the term of this patent is extended or adjusted under 35 U.S.C. 154(b) by 817 days.

(21) Appl. No.: 11/720,711

(22) PCT Filed: Sep. 29, 2005

(86) PCT No.: PCT/JP2005/017926
§ 371 (c)(1),
(2), (4) Date: Aug. 1, 2007

(87) PCT Pub. No.: WO2006/059428
PCT Pub. Date: Jun. 8, 2006

(65) Prior Publication Data
US 2008/0110018 A1    May 15, 2008

(30) Foreign Application Priority Data
Dec. 3, 2004 (JP) .................................. 2004-352060

(51) Int. Cl.
*H05K 3/20* (2006.01)
(52) U.S. Cl. .................. 29/831; 29/851; 174/256
(58) Field of Classification Search .................. 156/150, 156/233, 249, 289; 174/255, 261; 438/613, 438/761; 29/831, 846, 847, 848, 851
See application file for complete search history.

(56) References Cited

U.S. PATENT DOCUMENTS

| 5,256,474 A | 10/1993 | Johnston |
| 5,482,586 A * | 1/1996 | Fujikake et al. ............... 156/233 |
| 6,884,709 B2 * | 4/2005 | Iijima et al. .................... 438/613 |

FOREIGN PATENT DOCUMENTS

| JP | 09-046041 | 2/1997 |
| JP | 10-093242 | 4/1998 |

(Continued)

OTHER PUBLICATIONS

International Search Report dated Dec. 20, 2005 (4 pages).

(Continued)

*Primary Examiner* — Donghai D Nguyen
(74) *Attorney, Agent, or Firm* — Lerner, David, Littenberg, Krumholz & Mentlik, LLP

(57) ABSTRACT

A process for manufacturing a multilayer wiring board including the steps of forming an insulating layer on a base provided with a bump for interlayer connection, bonding a copper foil onto the insulating layer by a thermocompression bonding by sandwiching the copper foil between stainless steel plates, and patterning the copper foil, in which a metal foil is interposed at least between each of the stainless plates and the copper foil at the time of the thermocompression bonding. At this time, a mold release layer is formed on a surface of the metal foil to be imposed. Thus, such a multilayer wiring board can be manufactured that prevents sticking of a product after molding (cementing of the copper foil) and excels in dimensional stability without occurrence of wrinkling and ruggedness.

9 Claims, 3 Drawing Sheets

FOREIGN PATENT DOCUMENTS

| | | |
|---|---|---|
| JP | 2000-196238 | 7/2000 |
| JP | 2003-008200 | 1/2003 |
| JP | 2003-129259 | 5/2003 |
| JP | 2003-347728 | 12/2003 |
| JP | 2004-221310 | 8/2004 |

OTHER PUBLICATIONS

Supplementary European Search Report, EP 05788279, dated Aug. 26, 2009.

Shimada O; Hisano K; Iwasaki H; Ishizuka M; Fukuoka Y ED—Bhavnani S H; Kormann G B; Nelson D J: "Thermal management estimations for buried bump interconnection technology printed wiring boards with bump (filled via) interconnection" Thermal and Thermomechanical Phenomena in Electronic Systems, 1998. IT HERM '98. The Sixth Intersociety Conference on Seattle, WA, USA May 27-30, 1998, 19980627-19980530 New York, NY, USA,IEEE, US, May 27, 1998, pp. 468-474.

* cited by examiner

METHOD FOR MANUFACTURING MULTILAYER WIRING BOARD

CROSS REFERENCE TO RELATED APPLICATIONS

The present application claims priority to Japanese Patent Document No. 2004-352060 filed on Dec. 3, 2004, the disclosure of which is herein incorporated by reference.

BACKGROUND

This invention relates to a method for manufacturing a multilayer wiring board allowing interlayer connection with a bump, and more particularly to a technology for preventing sticking at the time of molding.

To manufacture a so-called build-up multilayer wiring board, it is necessary to laminate insulating layers and conductive layers one by one to pattern each of the conductive layers to a predetermined wiring pattern and to facilitate interlayer connection between the conductive layers. Consequently, technologies for forming a fine pattern on the conductive layers and for achieving effective interlayer connection become more important.

As a method for manufacturing the build-up multilayer wiring board, such a method has been known that bumps, which are provided to a copper foil, are buried in the insulating layer and thereafter the other copper foil is cemented onto the insulating layer to connect to the bumps (see, e.g., Patent Document 1).

The invention described in Patent Document 1 relates to a selective etching method and a selective etching apparatus both for forming the bumps. Patent Document 1 discloses technologies for manufacturing a multilayer wiring circuit board in which an etching barrier layer is provided to a main face of the copper foil to be provided with the bump; a member used for forming a wiring circuit board, which is provided with a copper foil used for forming a conductive circuit, is used as a base on a main surface of the etching barrier; and this member is processed as appropriate to obtain the multilayer wiring circuit board.

Through the technologies for manufacturing the multilayer wiring circuit board, first, the copper foil of the member used for forming the wiring circuit board is selectively etched to form the bumps for interlayer connection, and the intervals between the bumps are filled by the insulating layer to insulate each of the intervals. Next, the copper foil used for forming the conductive circuit is formed on upper surfaces of the insulating layer and the bumps. Subsequently, wiring films are formed by selectively etching the copper foils at both upper and lower surfaces. Consequently, the multilayer wiring board is formed, in which the wiring films are provided at both the upper and lower surfaces and the bumps connect the wiring films to each other.

Patent Document 1 is Japanese Patent Laid-Open Publication 2003-129259.

To manufacture the multilayer wiring board, it is necessary to cement the copper foil to the upper surfaces of the bumps through a molding process in which the resultant mass is sandwiched between stainless steel plates and pressurized therein to perform a thermocompression bonding to the copper foil.

Unlike a normal molding, this molding process requires application of high pressure to the extent that the bumps are squashed to some extent. This is because the copper foil only contacts the top surfaces of the bumps, but they need to be unified upon pressurization to the extent that the bumps are squashed so as to ensure a binding force. Consequently, a pressure applied in this molding is 90 to 150 kg/cm$^2$, which is about three times as high as a pressure of about 35 to 40 kg/cm$^2$ set in the normal molding. In the case of using a polyimide resin for the insulating layer, for example, not only a pressure but also a high temperature of about 335 degrees Celsius is applied.

Molding at a high temperature and a high pressure has a problem such as poor workability since the sticking occurs between the molded multilayer wiring board and each of the stainless steel plates especially at top portions of the bumps to make it difficult to take the product (the multilayer wiring board) off. It is difficult for an operator, for example, to disassemble the product by hand, thereby requiring some sort of tool, for example, to drive a wedge in gaps.

Where the sticking occurs, the product receives application of the force at the time of peeling, causing a fold, a wrinkle, ruggedness, distortion, a curl, and the like. The sticking occurs especially at the bump portions, leading to a big problem at an area that is densely packed with the bumps. Occurrence of wrinkling, ruggedness, or the like in the product enhances dimensional variation, which gets in the way of ensuring accuracy in patterning of wiring.

Furthermore, there is a possibility of causing a problem in intimate contact between the polyimide resin and the copper foil. For example, in molding by sandwiching the resultant mass between the stainless steel plates with a solid surface, the cemented copper foil is rigidly supported in a straight manner, thereby not being deformed along the lines of the bumps. As a result, the intimate contact between the cemented copper foil and the polyimide resin cannot be ensured, causing a so-called bleaching phenomenon.

SUMMARY

This invention is proposed in consideration of the aforementioned conventional situations and is intended to provide a method for manufacturing a multilayer wiring board that prevents sticking of the product after molding (cementing of copper foil) to a stainless steel plate and excels in dimensional stability without occurrence of wrinkling and ruggedness. Furthermore, this invention is intended to provide a method for manufacturing a multilayer wiring board that ensures intimate contact between a copper foil and a polyimide resin (an insulating layer) to be cemented to each other.

To achieve the aforementioned objects, the method for manufacturing a multilayer wiring board according to this invention includes the steps of forming an insulating layer on a base provided with a bump for interlayer connection, bonding a copper foil onto the insulating layer by a thermocompression bonding by sandwiching the copper foil between stainless steel plates, and patterning the copper foil, in which a metal foil is interposed at least between each of the stainless steel plates and the copper foil at the time of the thermocompression bonding.

By this manufacturing method according to this invention, the metal foil (the copper foil, for example) is interposed between the stainless steel plate and the copper foil at the time of molding, so that the product (the multilayer wiring board) is not stuck to the stainless steel plate even where the molding is performed at a high temperature and a high pressure. Therefore, an extra force is not applied to the product in disassembling after the molding, thereby resolving occurrence of wrinkling, ruggedness, folds, distortion, curls, and the like. Furthermore, special tools are not required at the time of the disassembling, thereby resolving degradation of workability.

Furthermore, the metal foil to be interposed serves as a buffer to accept deformation of the copper foil to be cemented. Thus, the copper foil is deformed in association with the bumps, which project to some extent, and the copper foil and the insulating layer are brought into intimate contact with each other at the time of thermocompression bonding, thereby ensuring intimate contact certainly.

According to the invention described above, such a multilayer wiring board can be manufactured with good workability that prevents the sticking of the product after the molding (cementing of the copper foil) to the stainless steel plate and excels in dimensional stability without occurrence of wrinkling, ruggedness, and the like. Furthermore, intimate contact between the copper foil and the insulating layer (the polyimide resin) can be ensured to avoid a bleaching phenomenon and the like.

Additional features and advantages of the present invention are described in, and will be apparent from, the following Detailed Description and the Figures.

DETAILED DESCRIPTION

Hereinafter, a method for manufacturing a multilayer wiring board to which this invention is applied will be explained in detail with reference to the drawings.

Figure 1:
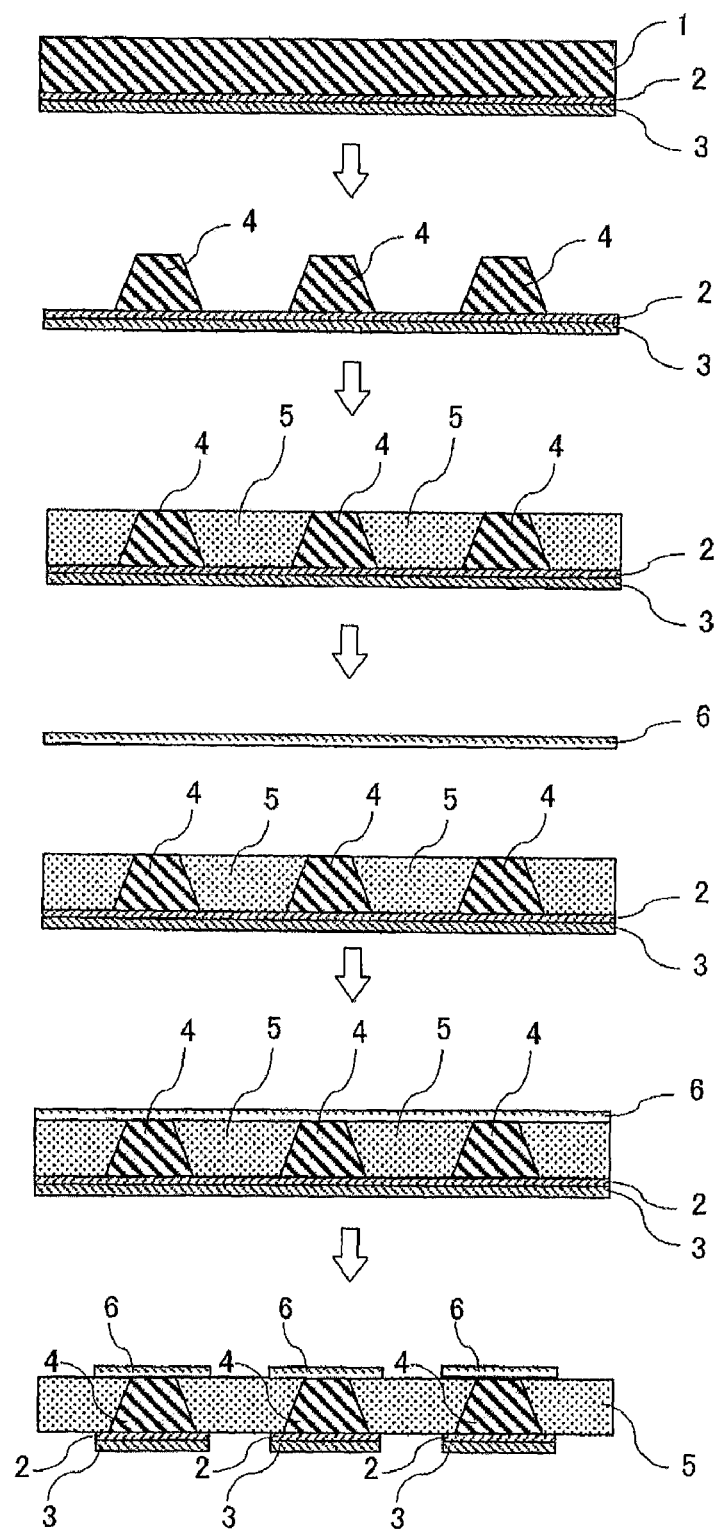
FIG. 1 illustrates an example of a process of manufacturing a multilayer wiring board, in which a first step is a cross-sectional view showing a clad material; a second step is a cross-sectional view showing a process of forming bumps; a third step is a cross-sectional view showing a process of forming an insulating layer; a fourth step is a cross-sectional view showing a process of placing a copper foil; a fifth step is a cross-sectional view showing a thermocompression bonding process of the copper foil; and a sixth step is a cross-sectional view showing a patterning process of the copper foil.

In manufacturing the multilayer wiring board utilizing bump-connection, as shown in a first step in FIG. 1, a clad material is prepared first, which is formed by laminating a copper foil 1 used for formation of bumps, an etching barrier layer 2 made of Ni, and a copper foil 3 used as a first wiring layer. Herein, the etching barrier layer 2 exhibits etching-selectivity with respect to the copper foil 1 and functions as an etching stopper at the time of etching of the copper foil 1. The copper foil 3 is eventually formed as a wiring layer by patterning, but functions as a supporter as well for supporting the bumps formed by etching the copper foil 1 and the etching barrier layer 2 in this stage.

As shown in a second step in FIG. 1, bumps 4 are formed by etching the copper foil 1. It is desirable to perform the etching to the copper foil 1 by combining the etching using acidic etching liquid and the etching using alkali etching liquid. That is, after formation of a resistant film (illustration is omitted) serving as a mask on the copper foil 1, the acidic etching liquid (for example, copper chloride) is sprayed thereon. Thus, the copper foil 1 is subjected to the etching in a manner to set an etching depth using this acidic liquid to be less than a thickness of the copper foil 1 so the etching barrier layer 2 is not exposed. Next, the etching is performed to a remaining area of the copper foil 1 by using the alkali etching acid (for example, ammonium hydroxide) after wet-cleaning (rinsing). The alkali etching liquid hardly affects Ni composing the etching barrier layer 2, so that the etching barrier layer 2 functions as a stopper to stop the etching by the alkali etching liquid. At this time, it is desirable that a pH value of the alkali etching liquid is less than 8.0. By setting the alkali etching liquid to the aforementioned pH, the copper foil 1 can be etched comparatively fast without affecting the etching barrier layer 2. The etching barrier layer 2 is also removed after formation of the bumps 4. In this case, however, only Ni as the etching barrier layer 2 is removed by the etching and an etching liquid is used to the copper foil 3 under the etching barrier layer 2, the etching liquid hardly affecting the copper foil 3.

Next, as shown in the third step in FIG. 1, an insulating layer 5 is formed in a manner to fill intervals between the bumps 4. The insulating layer 5 can be formed by, for example, applying a resin material such as polyimide or bonding a resin film by the thermocompression bonding. As the resin material used herein, an arbitrary material can be selected according to necessary characteristics without the need to consider especially intimate contact, a glass transition point, a linear expansion coefficient, or the like with respect to plating. Furthermore, a thickness or the like is not limited.

After formation of the insulating layer 5, the surface is polished, for example, so that top surfaces of the bumps 4 are exposed. As shown in a fourth step in FIG. 1, a copper foil 6 is then cemented onto the insulating layer 5 by the thermocompression bonding, as shown in a fifth step in FIG. 1.

The cementing (molding) is performed by a so-called thermocompression bonding. In thermocompression bonding of the copper foil 6, laminated bodies shown in a fourth step or a fifth step in FIG. 1 are placed repeatedly between stainless steel plates and the thermocompression bonding is carried out at once.

Figure 2:
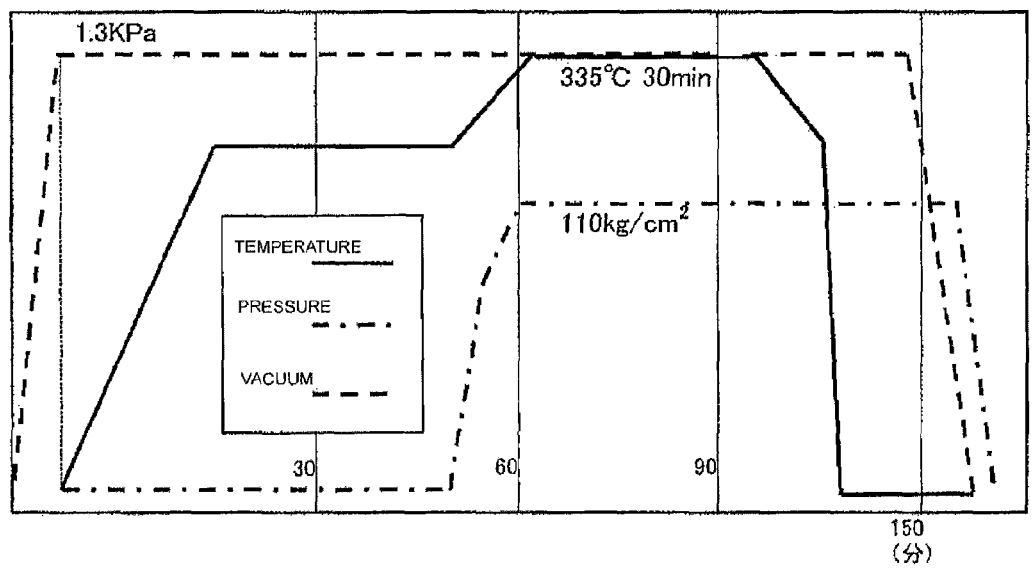
FIG. 2 is a view showing profiles of a temperature, a pressure, and a vacuum in the thermocompression bonding process.

A pressure at the time of the press is about 90 to 150 kg/cm$^2$ while a press temperature is about 335 degrees Celsius. FIG. 2 is a view showing one example of a temperature profile, a pressure profile, and a vacuum profile at the time of the press (the thermocompression bonding). In this example, a temperature is raised up to 335 degrees Celsius after advance preheating at 200 degrees Celsius and the press is performed at a pressure of 110 kg/cm$^2$. A vacuum is set to 1.3 kPa.

Figure 3:
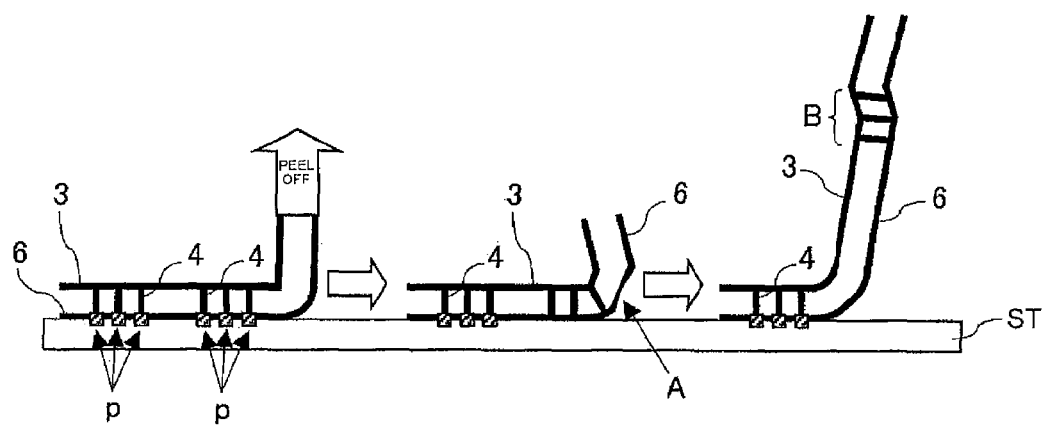
FIG. 3 is a frame format of a condition of sticking after the thermocompression bonding process.
Figure 4:
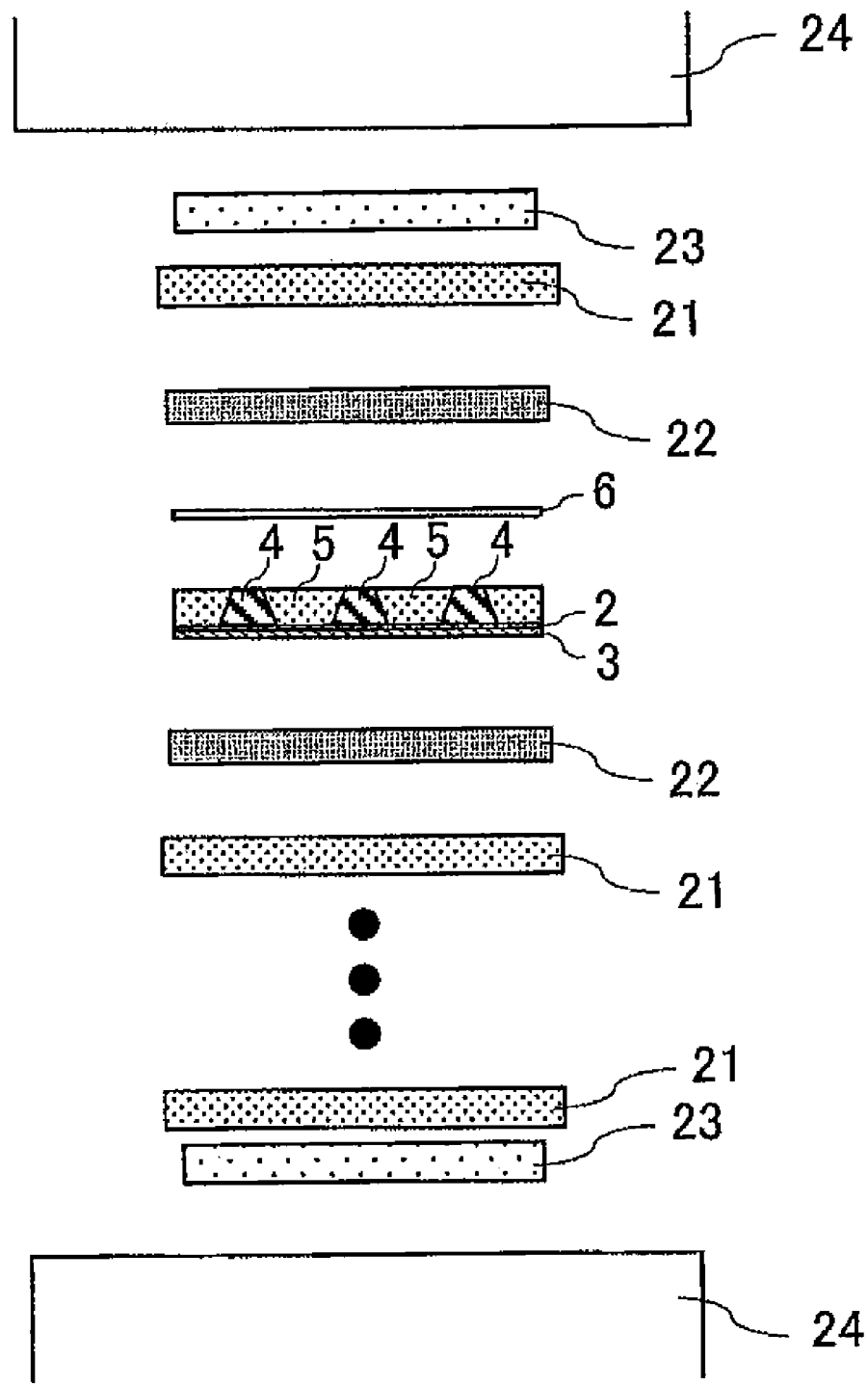
FIG. 4 is a cross-sectional view showing a superposition state of stainless steel plates in an embodiment.

In the thermocompression bonding by sandwiching the product between the stainless steel plates in the above manner, the temperature and the pressure are high while weight is applied on the top surfaces of the bumps 4 in a concentrated manner, so that the sticking to the stainless steel plates sometimes occurs. FIG. 3 shows a condition of the product's sticking. As shown in FIG. 3, the copper foil 6 is stuck to the stainless steel plate ST after the thermocompression bonding in association with locations where the bumps 4 are formed. In FIG. 3, a point p indicates places where the sticking occurs.

Where the product is taken off from the stainless steel plate ST in a condition where the copper foil 6 is cemented, for example, a force is applied to point A in FIG. 3, leading to a phenomenon where ruggedness is formed in part B in FIG. 3. The aforementioned sticking occurs in an area corresponding to the bumps 4, so that the aforementioned phenomenon tends to occur in the area densely packed with the bumps 4. Furthermore, concentration of the weight described above has a negative effect on intimate contact between the copper foil 6 and the insulating layer 5.

Therefore, a metal foil is interposed between each of the stainless steel plates 21 and the copper foil 6 to prevent the sticking. To be more specific, a copper foil 22 is placed corresponding to each surface of the laminated body shown in the fourth step or the fifth step in FIG. 1a. That is, the copper foils 22 are interposed between the copper foil 6 and the stainless steel plate 21 to be subjected to the thermocompression bonding and between a copper foil 3 as a supporter and the stainless steel plate 21, respectively. Outer sides of the outmost stainless steel plates 21 are provided with cushioning members 23, respectively, and the laminated body is sandwiched by a press machine 24 with these cushioning members 23 interposed.

In the superposition, it is only necessary to interpose the copper foil 22 at least between the copper foil 3 and the stainless steel plate 21 to be subjected to the thermocompression bonding. In the case where the copper foil 3 is subjected to an antirust process, for example, the copper foil 22 between the copper foil 3 and the stainless steel plate 21 may be omitted.

Herein, the copper foil 22 does not necessarily have to be a copper foil, and a metal foil made of an arbitrary metal may be used. However, it is desirable that the copper foil 22 (metal foil) to be used have a surface with a mold release property. To be more specific, it is desirable to form a mold release layer on a surface of the copper foil 22, for example.

The mold release layer in this case may include an antirust layer formed on the surface of the copper foil 22, for example. A Ni—Cr plated layer, a Ni—Cr—Zn plated layer, or the like may be cited as the antirust layer. Furthermore, the oxidation layer formed on the surface of the copper foil 22 can be used as the mold release layer.

After the thermocompression bonding of the copper foil 6 as described above, conductive layers (the copper foils 3, 6) on both front and back surfaces are subjected to a patterning according to a desired wiring pattern, thereby being set as wiring layers. The aforementioned patterning can be performed by general photolithography and etching technologies. The double-sided wiring board can be obtained in this manner. However, the board may be further layered.

By the method for manufacturing the multilayer wiring board according to this embodiment, the antirust layer or the oxidation layer formed on the surface of the copper foil 22 interposed between the stainless steel plate 21 and the copper foil 6 functions as a mold release layer, thereby being able to prevent the sticking of the product to the stainless steel plate 21 after the molding (the cementing of the copper foil 6). Thus, the multilayer wiring board that excels in dimensional stability can be produced without occurrence of wrinkles and ruggedness. Furthermore, the product can be easily taken off from the stainless steel plate 21, so that a disassembling operation can be easily performed maintaining good workability without requiring use of special tools. Furthermore, the copper foil 6 can be deformed to some extend by interposing the copper foil 22, leading to improvement in intimate contact between the copper foil 6 and the insulating layer 5.

EMBODIMENTS

Hereinafter, detailed embodiments to which this invention is applied will be explained based on an experimental result.

Comparative Example

First, the molding was performed by the conventional method. That is, the product was sandwiched between regular stainless steel plates to perform the thermocompression bonding (the molding). The manufacturing process is the same as that of a first embodiment. As a result, the sticking of the product occurred, causing wrinkles and ruggedness in the obtained product. Furthermore, taking the product off was so difficult that a wedge was driven to take the product off. The dimensional stability (variation) $3\sigma$ in the comparative example was value of 0.05% (N–number=50 W), which means a wide range of variation.

First Embodiment

In the thermocompression bonding, the copper foil 22 subjected to an antirust process was interposed between the copper foil 6 and the stainless steel plate 21. The copper foil 22 used herein has a thickness of 12 μm and a low profile (3 μm).

On the other hand, with respect to the copper foil 3, the antirust process was left intact on a surface facing the stainless steel plate 21 to correspond with the copper foil 22. The copper foil 3 was subjected to a surface roughening process to come into intimate contact with the polyimide resin serving as the insulating layer 5. A protective film was cemented to the surface facing the stainless steel plate 21 at the time of the surface roughening process to leave the antirust process intact.

In this embodiment, none of folds, wrinkling, distortion, curls, ruggedness, and the like due to the sticking were observed in the finished product. Furthermore, the dimensional stability (variation) $3\sigma$ was value of 0.037% (N–number=156 W), which is remarkably smaller than that of the comparative example.

Second Embodiment

This embodiment is also an example where the copper foils are interposed in a manner similar to the previous embodiment. However, in this embodiment, the copper foils 22 subjected to the antirust process were placed on both sides of the product, respectively. That is, the copper foils 22 were interposed between the copper foil 6 and the stainless steel plate 21 and between the copper foil 3 and the stainless plate 21, respectively. The copper foil 22 used herein has a thickness of 12 μm and a profile (3 μm).

In this embodiment also, none of folds, wrinkling, distortion, curls, ruggedness, and the like due to the sticking were observed in the finished product. Furthermore, the dimensional stability (variation) $3\sigma$ was value of 0.016% (N–number=30 W), which is remarkably smaller than that of the comparative example and is less than half that of the first embodiment.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method for manufacturing a multilayer wiring board, the method comprising:
   forming an insulating layer on a base provided with a bump made of copper for interlayer connection;
   bonding a copper foil onto the insulating layer by lamination by sandwiching the copper foil between stainless steel plates; and
   patterning the copper foil, wherein a respective metal foil is interposed at least between each of the stainless steel plates and the copper foil, the stainless steel plate directly contacting the respective metal foil, so as to reduce concentration of pressure at locations of the bumps at the time of the lamination.

2. The method for manufacturing a multilayer wiring board according to claim 1, wherein the metal foil is a copper foil.

3. The method for manufacturing a multilayer wiring board according to claim 1, wherein the insulating layer is made of a polyimide resin.

4. The method for manufacturing a multilayer wiring board according to claim 1, wherein the lamination includes a thermocompression bonding of the copper foil.

5. A method for manufacturing a multilayer wiring board, the method comprising:

forming an insulating layer on a base provided with a bump made of copper for interlayer connection;

bonding a copper foil onto the insulating layer by lamination by sandwiching the copper foil between stainless steel plates; and patterning the copper foil, wherein a metal foil is interposed at least between each of the stainless steel plates and the copper foil so as to reduce concentration of pressure at locations of the bumps at the time of the lamination, wherein the metal foil is provided with a mold release layer at a surface of the metal foil, and the mold release layer is formed of a plated layer or an oxidation layer.

6. The method for manufacturing a multilayer wiring board according to claim 5, wherein the mold release layer includes an antirust layer.

7. The method for manufacturing a multilayer wiring board according to claim 5, wherein the metal foil is a copper foil.

8. The method for manufacturing a multilayer wiring board according to claim 5, wherein the insulating layer is made of a polyimide resin.

9. The method for manufacturing a multilayer wiring board according to claim 5, wherein the lamination includes a thermocompression bonding of the copper foil.

* * * * *